US010309481B2

(12) United States Patent
Orita

(10) Patent No.: US 10,309,481 B2
(45) Date of Patent: Jun. 4, 2019

(54) CONTROL DEVICE OF VARIABLE STIFFNESS MECHANISM

(71) Applicant: HONDA MOTOR CO., LTD., Tokyo (JP)

(72) Inventor: Atsuo Orita, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 353 days.

(21) Appl. No.: 15/429,061

(22) Filed: Feb. 9, 2017

(65) Prior Publication Data

US 2017/0254383 A1    Sep. 7, 2017

(30) Foreign Application Priority Data

Mar. 7, 2016   (JP) .................................. 2016-043813

(51) Int. Cl.
| | |
|---|---|
| *F16F 15/00* | (2006.01) |
| *F16F 1/36* | (2006.01) |
| *F16F 1/40* | (2006.01) |
| *H02N 1/04* | (2006.01) |
| *B81B 3/00* | (2006.01) |

(52) U.S. Cl.
CPC ............ *F16F 15/002* (2013.01); *B81B 3/007* (2013.01); *F16F 1/3615* (2013.01); *F16F 1/40* (2013.01); *H02N 1/04* (2013.01); *F16F 2224/025* (2013.01); *F16F 2228/066* (2013.01)

(58) Field of Classification Search
CPC ....................................................... B81B 3/007
See application file for complete search history.

(56) References Cited

U.S. PATENT DOCUMENTS

| | | | |
|---|---|---|---|
| 6,882,086 B2 * | 4/2005 | Kornbluh | ......... B60G 17/01941 |
| | | | 310/328 |
| 9,627,996 B1 * | 4/2017 | Orita | ...................... H01L 41/042 |
| 10,036,674 B2 * | 7/2018 | Orita | ...................... G01L 1/142 |

FOREIGN PATENT DOCUMENTS

JP    2003-174205    6/2003

* cited by examiner

*Primary Examiner* — Hai L Nguyen
(74) *Attorney, Agent, or Firm* — Rankin, Hill & Clark LLP

(57) ABSTRACT

A control device of a variable stiffness mechanism controls a total stiffness by variably outputting a voltage from a DC power source 10 to an "m" number of stiffness control elastomers 1 among a plurality of dielectric elastomers 1 of a variable stiffness mechanism 100. Further, in a state in which a square-wave signal is being output from a square-wave power source 11 to an "n" number of electrostatic capacitance estimation elastomers 1, a detection value of energizing current is acquired and the acquired detection value is used to estimate an electrostatic capacitance.

7 Claims, 4 Drawing Sheets

CONTROL DEVICE OF VARIABLE STIFFNESS MECHANISM

BACKGROUND OF THE INVENTION

Field of the Invention

The present invention relates to a control device of a variable stiffness mechanism having dielectric elastomers that elastically deform according to an applied voltage.

Description of the Related Art

A dielectric elastomer is characterized in that, when a voltage is applied thereto, the dielectric elastomer is compressed by Maxwell stress in the direction of an electric field produced by the applied voltage. Further, the stiffness or the like of the dielectric elastomer (hereinafter referred to simply as "the elastomer" in some cases) can be controlled to a predetermined desired state by variably manipulating the voltage applied to the elastomer. Due to the characteristic, the elastomers have been used in a variety of technical fields in recent years.

For example, Japanese Patent Application Laid-Open No. 2003-174205 (hereinafter referred to as "Patent Document 1") proposes a device in which a sheet-like elastomer is interposed between two members, which are mutually relatively displaceable, and the voltage applied to the elastomer is manipulated thereby to enable the stiffness between the two members to be changed.

In a variable stiffness mechanism configured to have elastomers interposed between two members, the stiffness between the two members can be changed over an extensive range by interposing a plurality of elastomers between the two members and manipulating the voltage applied to each of the plurality of elastomers.

Meanwhile, in order to properly control the stiffness of this type of variable stiffness mechanism, it is frequently desired to make it possible to acquire the amount of the relative displacement between the two members or a state amount closely related thereto.

In this case, it is conceivable to, for example, directly measure the amount of the relative displacement between the two members or the elastic deformation amount of the elastomers that corresponds to the amount of the relative displacement by using a displacement sensor, such as a distance sensor, or the like. However, the displacement sensor is required to be disposed in the vicinity of the elastomers or the two members, thus frequently leading to structural restrictions. Further, the elastomers can flexibly deform in shape in response to an external force, so that it is generally difficult to measure, with high reliability, the elastic deformation amount of the elastomers by using a displacement sensor.

On the other hand, the elastomers are electrical insulators, so that the elastomers function as capacitive elements. Further, the electrostatic capacitance of the elastomers as the capacitive elements are highly correlated to the thicknesses of the elastomers (the thicknesses in the direction in which an electric field acts), or the values of geometric dimensions, such as areas or the like. Further, the electrostatic capacitance of elastomers can be estimated from electrical detection values, such as current values, so that a system for measuring the electrostatic capacitance is less likely to be subjected to structural restrictions.

Hence, the electrostatic capacitance of the elastomer could be measured (estimated) as a state amount closely related to the amount of the relative displacement between the two members.

In this case, it is desired that the processing of variable control of the stiffness of the elastomers between the two members and the processing of estimating the electrostatic capacitance can be carried out in parallel without mutual interference.

SUMMARY OF THE INVENTION

The present invention has been made in view of the foregoing background and an object of the invention is to provide a control device of a variable stiffness mechanism having a plurality of dielectric elastomers interposed between two members that are relatively displaceable, the control device being capable of variably controlling the total stiffness of dielectric elastomers between the two members and of estimating the electrostatic capacitance of the dielectric elastomers in parallel and in an accurate manner without mutual interference.

To this end, the control device of a variable stiffness mechanism in accordance with the present invention is a control device of a variable stiffness mechanism which includes a first member and a second member, which are relatively displaceable with each other, and a plurality of dielectric elastomers interposed in parallel between the first member and the second member such that an elastic force is generated according to the relative displacement of the first member and the second member, and which is configured to be capable of changing a stiffness of each of the dielectric elastomers by variably manipulating a voltage to be applied to each of the dielectric elastomers, the control device including:

a first power source that variably outputs a voltage for controlling the stiffness of each of an "m" number (m: an integer of 1 or more) of dielectric elastomers among the plurality of dielectric elastomers to each of the "m" number of the dielectric elastomers;

a second power source that outputs a voltage signal which has a predetermined cycle for estimating an electrostatic capacitance of an "n" number (n: an integer of 1 or more) of dielectric elastomers among the plurality of dielectric elastomers excluding the "m" number of the dielectric elastomers, and which is for supplying a current correlated to the electrostatic capacitance of the "n" number of the dielectric elastomers to each of the "n" number of the dielectric elastomers; and an electrostatic capacitance estimating unit which acquires a detection value of an energizing current flowing between the second power source and the "n" number of the dielectric elastomers in a state in which the voltage signal is being output from the second power source, and which estimates the electrostatic capacitance of the "n" number of the dielectric elastomers by using the detection value of the energizing current (a first aspect of the invention).

In the present invention, "the electrostatic capacitance of the "n" number of the dielectric elastomers" means the total electrostatic capacitance (the resultant electrostatic capacitance) of the "n" number of the dielectric elastomers or the electrostatic capacitance per one dielectric elastomer.

According to the first aspect of the invention, among the plurality of dielectric elastomers (hereinafter may be referred to simply as "the elastomers") interposed between the first member and the second member, the "m" number of the elastomers is used as the elastomers for controlling the stiffness. A voltage for controlling the stiffness (a voltage variably manipulated according to a desired stiffness) is applied from the first power source to the "m" number of the elastomers.

In addition, the "n" number of the elastomers excluding the "m" number of the elastomers is used as the elastomers for estimating the electrostatic capacitance, and a voltage signal having a predetermined cycle for estimating the electrostatic capacitance is applied from the second power source to the "n" number of the elastomers.

In this case, the voltage signal is not intended to control the stiffness of the "n" number of the elastomers, so that the amplitude value of the voltage signal may be sufficiently small, as compared with the variable width of the voltage (the voltage for controlling the stiffness) imparted from the first power source to the "m" number of the elastomers.

Therefore, the voltage signal for estimating the electrostatic capacitance can be applied from the second power source to the "n" number of the elastomers such that the stiffness of the "n" number of the elastomers is mostly maintained to be constant (so as to hardly influence the total stiffness between the first member and the second member).

Further, the electrostatic capacitance of the "n" number of the elastomers is not influenced by the voltage applied from the first power source to the "m" number of the elastomers.

Hence, according to the first aspect of the invention, the total stiffness of a plurality of elastomers between the first member and the second member can be variably controlled and the electrostatic capacitance of the elastomers can be estimated in parallel and in an accurate manner without mutual interference.

Preferably, the foregoing first aspect of the invention is further provided with a displacement amount estimating unit which estimates an amount of the relative displacement between the first member and the second member from an estimated value of the electrostatic capacitance estimated by the electrostatic capacitance estimating unit (a second aspect of the invention).

Here, the electrostatic capacitance of the "n" number of the elastomers is not influenced by the voltage (the voltage for controlling the stiffness) applied from the first power source to the "m" number of the elastomers, so that the electrostatic capacitance has high correlation with the amount of the relative displacement between the first member and the second member. According to the second aspect of the invention, therefore, the amount of the relative displacement between the first member and the second member can be estimated with high reliability from an estimated value of the electrostatic capacitance.

The first aspect of the invention or the second aspect of the invention may adopt a mode in which a voltage signal output from the second power source is a voltage signal having a voltage value thereof changing in steps at a predetermined cycle, and the electrostatic capacitance estimating unit is configured to carry out energizing current sampling processing for acquiring the detection values of the energizing current at a plurality of sampling times in a current attenuation length, in which the energizing current increases and then attenuates according to a stepped change in the voltage value of the voltage signal and to carry out electrostatic capacitance estimation processing of determining an estimated value of the electrostatic capacitance of the "n" number of the dielectric elastomers from a model expressing a correlation between a time-dependent change in the energizing current and the electrostatic capacitance of the "n" number of the dielectric elastomers in the current attenuation length and the detection values of the energizing currents at the plurality of sampling times (a third aspect of the invention).

Here, if the voltage value of the voltage signal applied to the "n" number of the elastomers changes in steps (rapidly), then the entire energizing current of the "n" number of the elastomers will rapidly increase to a peak value and then attenuate due to a transient response phenomenon. Further, at this time, during the period in which the energizing current attenuates (the current attenuation length), the energizing current attenuates at a time constant defined by the value of the electrostatic capacitance of the "n" number of the elastomers and the resistance value of a current path of the energizing current (the total resistance value of resistive elements regarded to be connected in series with all the "n" number of the elastomers).

Hence, the actual time-dependent change in the energizing current of the "n" number of the elastomers in the current attenuation length has high correlation with the electrostatic capacitance of the "n" number of the elastomers.

In the third aspect of the invention, therefore, the electrostatic capacitance estimating unit carries out the energizing current sampling in the current attenuation length based on the transient response phenomenon. Thus, the detection values of the energizing current at the plurality of sampling times in the current attenuation length are acquired.

Then, the electrostatic capacitance estimating unit determines the estimated value of the electrostatic capacitance of the "n" number of the elastomers by the electrostatic capacitance estimation processing from the model and the detection values of the energizing current at the plurality of sampling times in the current attenuation length.

In this case, the time series of the detection values of the energizing current at the plurality of sampling times has high correlation with the electrostatic capacitance of the "n" number of the elastomers, so that the estimated value of the electrostatic capacitance of the elastomers can be properly determined by the electrostatic capacitance estimation processing.

As the voltage signal in the third aspect of the invention, a square-wave signal may typically be used.

In the third aspect of the invention, the quantity "n" of the "n" number of the elastomers is preferably plural (a fourth aspect of the invention).

More specifically, the greater a quantity "n" of the "n" number of the dielectric elastomers, the higher becomes the peak value of the energizing current flowing to all the "n" number of the dielectric elastomers due to the transient response phenomenon. For this reason, if the quantity "n" is plural, then the current markedly attenuates in the current attenuation length (i.e. the current attenuation amount per unit time is larger), as compared with the case where the quantity "n" is one.

Hence, a marked mutual difference will be observed in the detection values of the energizing current at the plurality of sampling times in the current attenuation length. This makes it possible to estimate the electrostatic capacitance with higher reliability by using the detection values of the energizing current and the foregoing model.

In the first to the fourth aspects of the invention described above, a current path between the first power source and the plurality of dielectric elastomers is preferably configured such that a quantity "m" or the combination of the "m" number of the dielectric elastomers can be selectively changed (a fifth aspect of the invention).

With this arrangement, if the quantity "m" can be changed, then the variable width of the total stiffness between the first member and the second member can be changed as appropriate by changing (i.e. increasing or decreasing) the quantity "m." Further, if the combination of the "m" number of the elastomers can be changed, then the elastomers to be used as the "m" number of the elastomers among the plurality of elastomers of the variable stiffness mechanism can be changed as appropriate, by considering, for example, the degree of progress of deterioration of each of the elastomers. This makes it possible to prevent, for example, any one elastomer from differing markedly in terms of the degree of progress of deterioration, as compared with the remaining elastomers.

Further, in the first to the fifth aspects of the invention, the current path between the second power source and the plurality of dielectric elastomers is preferably configured such that a quantity "n" or a combination of the "n" number of the dielectric elastomers can be selectively changed (a sixth aspect of the invention).

With this arrangement, if the quantity "n" can be changed, then the magnitude or the like of the current flowing to the "n" number of the elastomers can be changed by changing (increasing or decreasing) the quantity "n," thus enabling the accuracy of the estimation of the electrostatic capacitance to be changed, as appropriate. Further, if the combination of the "n" number of the elastomers can be changed, then the elastomers to be used as the "n" number of the elastomers among the plurality of elastomers of the variable stiffness mechanism can be changed as appropriate, by considering, for example, the degree of progress of deterioration of each of the elastomers. This makes it possible to prevent, for example, any one elastomer from differing markedly in terms of the degree of progress of deterioration, as compared with the remaining elastomers.

Supplementarily, in the fifth aspect of the invention or the sixth aspect of the invention, more specifically, a mode can be adopted, in which, for example, a controllable switch (a switch composed of a semiconductor switch element or the like) is installed in the current path between one or both of the first power source and the second power source and the plurality of elastomers. With this arrangement, changing the quantity "m" or the combination of the "m" number of the dielectric elastomers or changing the quantity "n" or the combination of the "n" number of the dielectric elastomers can be accomplished by controlling the foregoing switch.

In the first to the sixth aspects of the invention, a mode may be adopted, in which each of the dielectric elastomers of the variable stiffness mechanism is formed like a sheet, and configured such that the output voltage of the first power source or the second power source can be applied in a direction of a thickness thereof, and a peripheral edge portion and a central portion of each of the dielectric elastomers are fixed to the first member and the second member, respectively, which are relatively movable in the direction of the thickness of the dielectric elastomers, and each of the dielectric elastomers is tightly installed such that a tension thereto is imparted between the first member and the second member in a state in which no output voltage of the first power source or the second power source is being applied (a seventh aspect of the invention).

With this arrangement, each of the elastomers of the variable stiffness mechanism is tensioned between the first member and the second member in the state in which no output voltage of the first power source or the second power source is being applied. This enables the stiffness of each of the "m" number of the elastomers to be changed over an extensive range by manipulating the output voltage of the first power source applied to the "m" number of the elastomers among the plurality of elastomers of the variable stiffness mechanism.

Further, since each of the elastomers is formed like a sheet, a variable stiffness mechanism having many dielectric elastomers can be achieved in a compact design.

Thus, a variable stiffness mechanism in a compact design can be achieved, which is capable of variably controlling the stiffness between the first member and the second member over an extensive range, and also capable of, in parallel with the control of the stiffness, properly estimating the electrostatic capacitance closely correlated to the amount of the relative displacement between the first member and the second member.

DESCRIPTION OF THE PREFERRED EMBODIMENTS

Figure 1:
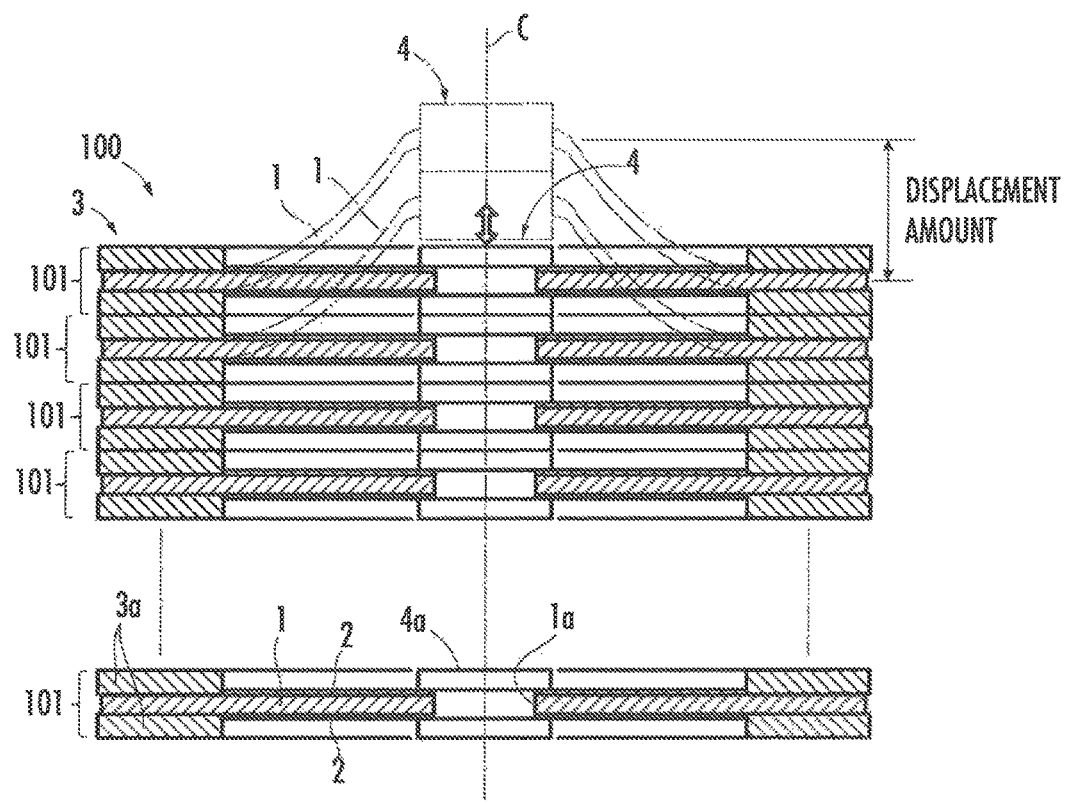
FIG. 1 is a diagram illustrating a variable stiffness mechanism according to an embodiment of the present invention.

An embodiment of the present invention will be described below with reference to FIG. 1 to FIG. 7. Referring to FIG. 1, a variable stiffness mechanism 100 according to the present embodiment is composed of a plurality of (an "n" number of) variable stiffness element members 101, each of which has a dielectric elastomer 1.

All of the plurality of the variable stiffness element members 101 are members having the same configuration. Each of the variable stiffness element members 101 includes the dielectric elastomer 1 which is formed like a sheet (hereinafter referred to simply as "the elastomer 1"), frame members 3a attached to the peripheral edges of the elastomer 1, and a movable member 4a installed at the central portion of the elastomer 1 such that the movable member 4a can relatively move with respect to the frame members 3a.

The elastomer 1 of each of the variable stiffness element members 101 can be made of, for example, a silicone resin, a urethane resin, an acrylic resin or the like. Further, film-like electrodes 2, 2 are firmly attached to both surfaces in the direction of the thickness of the elastomer 1 so as to coat the surfaces.

The frame members 3a are firmly attached to the elastomer 1, sandwiching the peripheral edge of the elastomer 1. In this case, the peripheral edge of the elastomer 1 is held by the frame members 3a such that the elastomer 1 is pulled (i.e. subjected to a pre-tension) along the surfaces thereof.

The movable member 4a is installed in a hole 1a opened at the central portion of the elastomer 1. Further, the movable member 4a relatively moves with respect to the frame members 3a by being guided along a central axis C of the elastomer 1 by an appropriate guide mechanism (not illustrated).

The variable stiffness mechanism 100 according to the present embodiment is composed of the plurality of variable stiffness element members 101 which are configured as described above and concentrically layered as illustrated in FIG. 1. In this case, the frame members 3a of the plurality of variable stiffness element members 101 are interconnected into one piece by an adhesive agent or an appropriate fastening mechanism or the like. Similarly, the movable members 4a of the plurality of variable stiffness element members 101 are interconnected into one piece by an adhesive agent or an appropriate fastening mechanism or the like.

Hereinafter, the assembly of the frame members 3a and the assembly of the movable members 4a of the plurality of variable stiffness element members 101 will be referred to simply as "the frame member 3" and the movable member 4, respectively. The frame member 3 and the movable member 4 correspond to the first member and the second member, respectively, in the present invention.

The variable stiffness mechanism 100 configured as described above is, in other words, a mechanism having the structure in which the plurality of sheet-like elastomers 1 serving as elastic members are interposed in parallel between the frame member 3 and the movable member 4.

In the variable stiffness mechanism 100, as the movable member 4 is displaced along the central axis C with respect to the frame member 3, the elastomers 1 mutually bend (i.e. elastically deform) in the same manner, as indicated by the two-dot chain lines in FIG. 1, and at the same time, an elastic force in a direction for returning the movable members 4 to their original balanced positions (more specifically, positions of a no-load state, in which no external force causing the movable member 4 to be relatively displaced with respect to the frame member 3 is being applied) is generated. In this case, the resultant force of the elastic forces (i.e. translational elastic forces along the central axis C) generated by the elastomers 1 is applied between the movable member 4 and the frame member 3.

Further, a voltage is applied to the elastomers 1 through the electrodes 2, 2 (i.e. an electric field is generated in the direction of the thickness of the elastomers 1) thereby to cause the elastomers 1 to be compressed in the direction of the thickness thereof due to the Maxwell stress. As a result, the elastomers 1, when in a state in which no external force is being applied (i.e. in a natural length state), stretch along the surfaces (i.e. the area observed in the direction of the thickness thereof increases).

Therefore, in the variable stiffness mechanism 100 according to the present embodiment, when a voltage is being applied to the elastomers 1 through the electrodes 2, 2, the tension (or the pre-tension) of the elastomers 1 between the movable member 4 and the frame member 3 decreases, and the stiffness of the elastomers 1 (i.e. the stiffness when the movable member 4 is relatively displaced along the central axis C with respect to the frame member 3) decreases.

Figure 2:
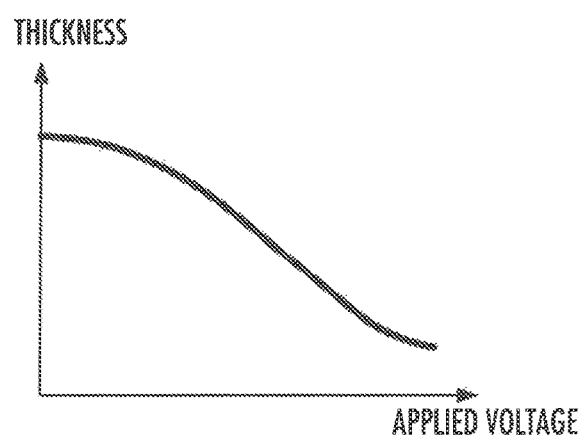
FIG. 2 is a graph illustrating the relationship between the applied voltage and the thickness of dielectric elastomers.

In this case, the thickness of each of the elastomers 1 decreases as the applied voltage increases, as illustrated in FIG. 2. Consequently, the stiffness of the elastomers 1 in association with the relative displacement between the movable member 4 and the frame member 3 decreases as the voltage applied to the elastomers 1 increases. Accordingly, the stiffness of the elastomers 1 can be variably controlled by manipulating the voltage applied to the elastomers 1.

Further, in the variable stiffness mechanism 100 according to the present embodiment, the total stiffness between the movable member 4 and the frame member 3 (the total stiffness of all the elastomers 1) reaches a minimum when a maximum voltage within a permissible range is applied to all the elastomers 1, while the total stiffness between the movable member 4 and the frame member 3 reaches a maximum when no voltage is being applied to any of the elastomers 1 (i.e. when the voltage applied to all the elastomers 1 is maintained at zero). In the following description, the total stiffness between the movable member 4 and the frame member 3 will be referred to simply as "the total stiffness of the variable stiffness mechanism 100."

Further, the total stiffness of the variable stiffness mechanism 100 can be changed between the foregoing maximum stiffness and minimum stiffness by changing the quantity of the elastomers 1 to which a voltage is applied or by changing the magnitude of the voltage applied to one or more elastomers 1.

The variable stiffness mechanism 100 can be installed in a variety of devices. For example, by connecting the movable member 4 and the frame member 3 to two links connected by a joint mechanism such that the relative displacement takes place between the movable member 4 and the frame member 3 at the same time as the two links relatively rotate, the stiffness of the joint mechanism between the two links can be changed.

Meanwhile, the elastomers 1 are electrical insulators and therefore function as capacitive elements (i.e. the elastomers 1 have electrostatic capacitance). In this case, the electrostatic capacitance of each of the sheet-like elastomers 1 is basically proportional to the area of the elastomer 1 (more specifically, the area observed in the direction of the thickness thereof) and inversely proportional to the thickness of the elastomer 1. Further, the relationship between the thickness and the area of each of the elastomers 1 in the state in which no external force is being applied (i.e. in the natural length state) is basically an inversely proportional relationship. Hence, the electrostatic capacitance of each of the elastomers 1 is basically inversely proportional to the square of the thickness of the elastomer 1.

Thus, the electrostatic capacitance of each of the elastomers 1 is closely related to the thickness of the elastomer 1 (i.e. the electrostatic capacitance has high correlation with the thickness).

Further, if the voltage applied to each of the elastomers 1 is maintained to be constant or substantially constant (including the case where the applied voltage is maintained at zero or substantially zero), then the thickness of the elastomer 1 basically changes according to the amount of the relative displacement (i.e. the amount of the relative displacement along the central axis C) between the frame member 3 and the movable member 4. In this case, as the amount of the relative displacement of the movable member 4 with respect to the frame member 3 increases, the bending amount of the elastomer 1 increases, so that the thickness of the elastomer 1 decreases.

Thus, the amount of the relative displacement between the frame member 3 and the movable member 4 has high correlation with the electrostatic capacitance of the elastomer 1 having the voltage applied thereto maintained to be constant or substantially constant. For this reason, once the actual electrostatic capacitance of the elastomer 1 is estimated, the actual amount of the relative displacement between the frame member 3 and the movable member 4 can be properly estimated on the basis of the estimated value of the actual electrostatic capacitance.

Figure 3:
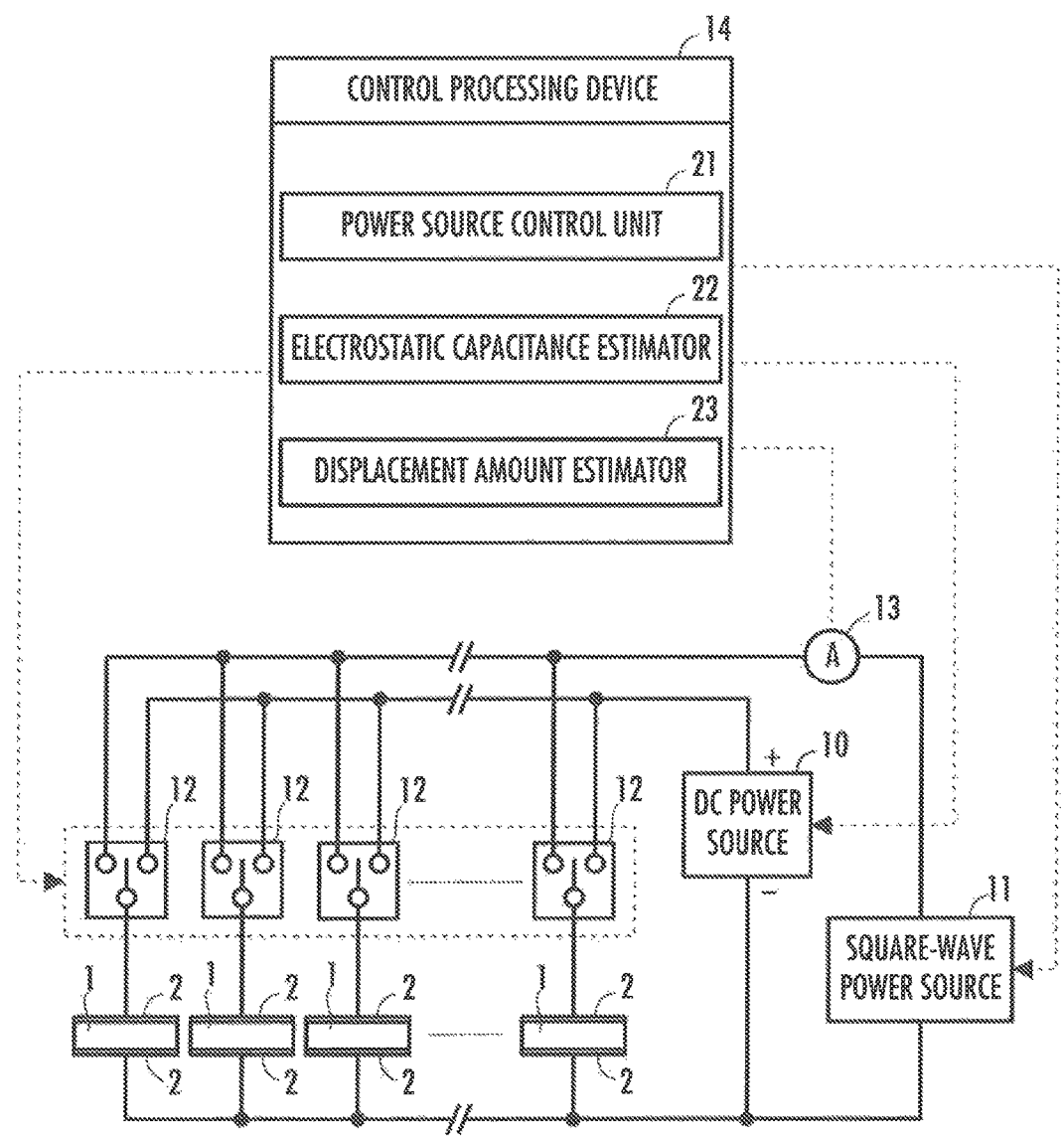
FIG. 3 is a diagram illustrating the general system configuration of a control unit of the variable stiffness mechanism according to the embodiment.

FIG. 3 illustrates the general configuration of a system capable of variably controlling the total stiffness of the variable stiffness mechanism 100, estimating the electrostatic capacitance of the elastomers 1, and estimating the amount of the relative displacement between the frame member 3 and the movable member 4 on the basis of the estimated value of the electrostatic capacitance. The system is an exemplary system of the control unit of the variable stiffness mechanism according to the present invention.

In this system, one or more elastomers 1 are utilized as the elastomers 1 for controlling the total stiffness of the variable stiffness mechanism 100 (hereinafter may be referred to as "the stiffness control elastomers 1"). Further, the total stiffness of the variable stiffness mechanism 100 is variably controlled in sequence by manipulating the voltage to be applied to the stiffness control elastomers 1.

Further, one or more elastomers 1 excluding the stiffness control elastomers 1 are utilized as the elastomers 1 for estimating the electrostatic capacitance (hereinafter referred to as "the electrostatic capacitance estimation elastomers 1"). The electrostatic capacitance of the electrostatic capacitance estimation elastomers 1 is sequentially estimated, and the amount of the relative displacement between the frame member 3 and the movable member 4 is sequentially estimated on the basis of the estimated value of the electrostatic capacitance.

In this case, the processing for estimating the electrostatic capacitance of the electrostatic capacitance estimation elastomers 1 applies a predetermined voltage signal to the electrostatic capacitance estimation elastomers 1 thereby to sequentially supply the current, which has the correlation with the electrostatic capacitance, to the electrostatic capacitance estimation elastomers 1. Then, based on the detection value of the energizing current, the electrostatic capacitance of the electrostatic capacitance estimation elastomers 1 is estimated.

The electrostatic capacitance estimated in the present embodiment is, more specifically, the electrostatic capacitance per one of the electrostatic capacitance estimation elastomers 1. If there is one elastomer 1 utilized as the electrostatic capacitance estimation elastomer 1, then the electrostatic capacitance will be the electrostatic capacitance of that one particular elastomer 1. If there are a plurality of elastomers 1 utilized as the electrostatic capacitance estimation elastomers 1, then the electrostatic capacitance will correspond to the mean electrostatic capacitance of the plurality of elastomers 1.

Further, in the system according to the present embodiment, among all the elastomers 1 of the variable stiffness mechanism 100, the quantity or the combination of the elastomers 1 to be utilized as the stiffness control elastomers 1 and the quantity or the combination of the elastomers 1 to be utilized as the electrostatic capacitance estimation elastomers 1 can be changed, as appropriate.

To fulfill the foregoing functions, the system illustrated in FIG. 3 includes a DC power source 10 which outputs a DC voltage for controlling the stiffness to the stiffness control elastomers 1, a square-wave power source 11 which outputs a square-wave signal serving as the voltage signal of a predetermined cycle (predetermined frequency) for estimating the electrostatic capacitance to the electrostatic capacitance estimation elastomers 1, changeover switches 12 provided for the elastomers 1 such that each of the elastomers 1 can be selectively connected to the DC power source 10 and the square-wave power source 11, a current detector 13 which detects the energizing current supplied from the square-wave power source 11 to the electrostatic capacitance estimation elastomers 1, and a control processing device 14. The DC power source 10 and the square-wave power source 11 correspond to the first power source and the second power source, respectively, in the present invention.

The changeover switches 12 are interposed in the current path between the DC power source 10 and the square-wave power source 11 and the elastomers 1. The changeover switches 12 are composed of semiconductor switching elements or the like, which enable the elastomers 1 corresponding thereto to be selectively controlled to a mode in which the elastomers 1 are electrically connected to the DC power source 10 or a mode in which the elastomers 1 are electrically connected to the square-wave power source 11.

Each of the elastomers 1 will be utilized as the stiffness control elastomer 1 when electrically connected to the DC power source 10 by the changeover switch 12 corresponding thereto, or will be utilized as the electrostatic capacitance estimation elastomer 1 when electrically connected to the square-wave power source 11.

The DC power source 10 is a power source capable of applying the DC voltage in parallel to each of one or more elastomers 1 serving as the stiffness control elastomers 1 through the changeover switches 12. Further, the DC power source 10 is configured to be capable of variably controlling the magnitude of the output voltage (the applied voltage) to the stiffness control elastomers 1 to a predetermined desired value within a predetermined permissible range.

The square-wave power source 11 is a power source capable of applying the square-wave signal in parallel to each of one or more elastomers 1 serving as the electrostatic capacitance estimation elastomers 1 through the changeover switches 12. The square-wave signal is a voltage signal that functions to periodically supply the current for estimating the electrostatic capacitance of the electrostatic capacitance estimation elastomers 1 (the current that has the correlation with the electrostatic capacitance) to the electrostatic capacitance estimation elastomers 1.

Figure 5:
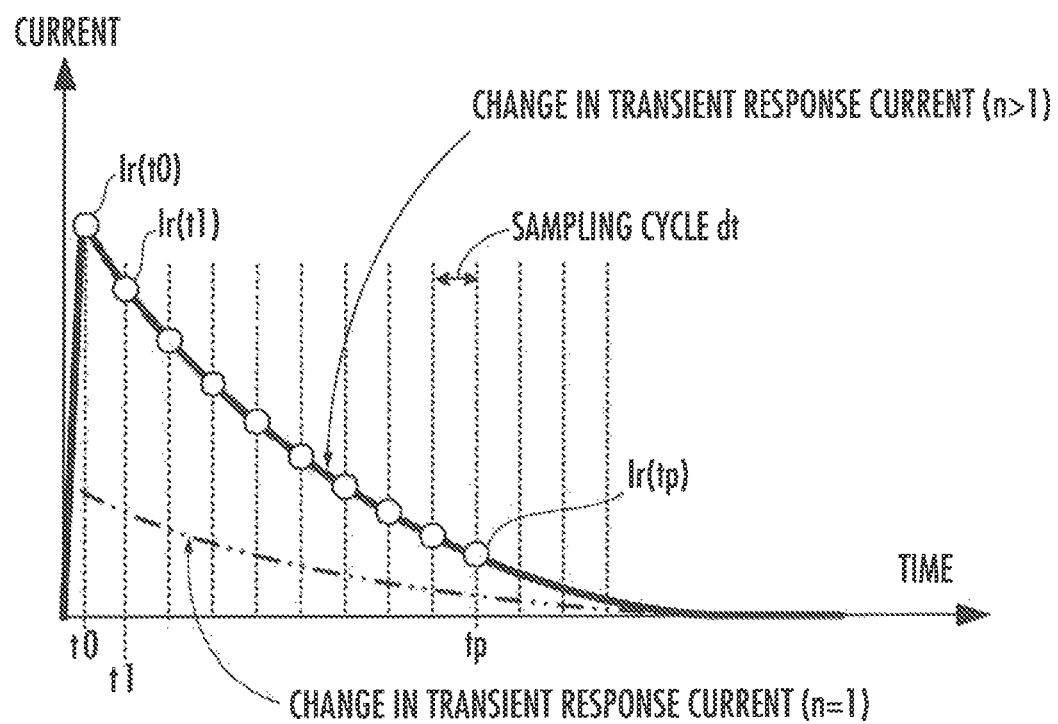
FIG. 5 is a graph illustrating the time-dependent changes in the energizing current flowing through an "n" number of dielectric elastomers to which the square-wave signal is imparted.

More specifically, the square-wave signal is a voltage signal for periodically supplying a current to the electrostatic capacitance estimation elastomers 1, the current changing with time, rapidly increasing and then attenuating as illustrated in FIG. 5 due to the transient response phenomenon caused by the stepped changes (rapid changes) in the voltage applied to the electrostatic capacitance estimation elastomers 1 (hereinafter referred to as "the transient response current"). In this case, during the period in which the transient response current attenuates (hereinafter referred to as "the current attenuation length"), the transient response current attenuates at a time constant based on the total electrostatic capacitance of the electrostatic capacitance estimation elastomers 1 and the resistance values of the resistance components (e.g. the electrodes 2, 2 and the changeover switches 12) in the current path between the electrostatic capacitance estimation elastomers 1 and the square-wave power source 11.

Figure 4:
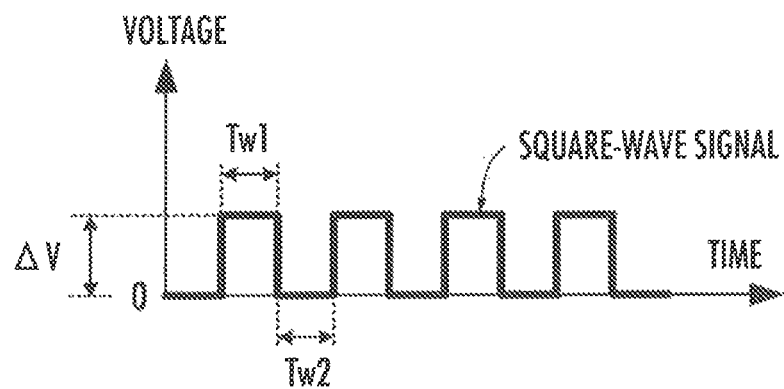
FIG. 4 is a diagram illustrating a square-wave signal output from a square-wave power source illustrated in FIG. 3.

Thus, according to the present embodiment, the square-wave signal for periodically supplying the transient response current to the electrostatic capacitance estimation elastomers 1 is a voltage signal which has a predetermined cycle and which has a certain amplitude value ΔV, which is sufficiently small as compared with the variable width of the output voltage of the DC power source 10 (the voltage applied to the stiffness control elastomers 1), as illustrated in FIG. 4, the mean voltage value of the voltage signal per cycle being zero or a value close to zero.

In this case, the amplitude width ΔV of the square-wave signal is set beforehand on the basis of experiments or the like such that the change in the thickness of each of the electrostatic capacitance estimation elastomers 1 in response to the voltage change in the amplitude value ΔV will be sufficiently small so as substantially not to influence the stiffness of the electrostatic capacitance estimation elastomer 1 (sufficiently small to an extent that the stiffness can be regarded to be maintained substantially constant), and the peak value of the transient response current flowing through the electrostatic capacitance estimation elastomer 1 according to a voltage change in ΔV will not reach an upper limit current (a limit current) of an overcurrent protection function of the square-wave power source 11. The overcurrent protection function of the square-wave power source 11 is a function that forcibly restricts a current (an output current or an input current) flowing through the square-wave power source 11 to the upper limit current when the current exceeds the predetermined upper limit current (the limit current).

Further, a pulse width Tw1 from a rise timing (a voltage increase timing) of the square-wave signal to a next fall timing (a voltage decrease timing) and a pulse width Tw2 from the fall timing to a next rise timing are set beforehand on the basis of experiments or the like such that the transient response current sufficiently attenuates within the time of the pulse width Tw1 and the pulse width Tw2.

For example, Tw1 and Tw2 can be set on the basis of the time constant calculated from a maximum value of the electrostatic capacitance that can be implemented by the deformation of the electrostatic capacitance estimation elastomers 1 and the resistance values of the resistance components (the electrodes 2, 2, the changeover switches 12 and the like) in the current path between the elastomers 1 and the square-wave power source 11, or Tw1 and Tw2 can be set on the basis of the actual measurement value of the transient response current when the square-wave signal is applied to the electrostatic capacitance estimation elastomers 1 in a state in which the displacement amount of the movable member 4 is set to a maximum. Tw1 and Tw2 may share the same time width.

Supplementarily, the square-wave signal in the present embodiment is a square-wave signal having the voltage value thereof varying between zero and ΔV (>0), as illustrated in FIG. 4. However, the square-wave signal may be a square-wave signal having the voltage value thereof varying between, for example, zero and −ΔV (<0), or a square-wave signal having the voltage value thereof varying between −(ΔV/2) and +(ΔV/2).

The control processing device 14 is comprised of one or a plurality of electronic circuit units that include a CPU or CPUs, a RAM or RAMs, a ROM or ROMs, an interface circuit or circuits, and the like. The control processing device 14 includes, as the functions implemented by the configuration of installed hardware or a program, a power source control unit 21, which controls the DC power source 10, the square-wave power source 11 and the changeover switches 12 thereby to control the voltage to be applied to the elastomers 1, an electrostatic capacitance estimator 22, which estimates the electrostatic capacitance of the elastomers 1, and a displacement amount estimator 23, which estimates the amount of the relative displacement between the frame member 3 and the movable member 4.

In the following description, for the sake of convenience, the amount of the relative displacement between the frame member 3 and the movable member 4 is defined as the amount of the relative displacement of the movable member 4 with respect to the frame member 3. Hereinafter, the amount of the relative displacement will be referred to as the displacement amount of the movable member 4.

The following will describe in detail the processing by the power source control unit 21, the electrostatic capacitance estimator 22, and the displacement amount estimator 23.

The power source control unit 21 selects the elastomers 1 to be utilized as the stiffness control elastomers 1 and the elastomers 1 to be utilized as the electrostatic capacitance estimation elastomers 1, and sequentially determines the desired value of an output voltage of the DC power source 10 to be applied to each of the selected stiffness control elastomers 1 (i.e. a voltage to be applied to each of the stiffness control elastomers 1).

In this case, according to the present embodiment, the number "m" of the elastomers 1 to be utilized as the stiffness control elastomers 1 and the number "n" of the elastomers 1 to be utilized as the electrostatic capacitance estimation elastomers 1 are determined according to the desired value of the total stiffness of the variable stiffness mechanism 100 (more specifically, the desired value of the index value indicating the degree of the total stiffness of the elastomers 1 between the frame member 3 and the movable member 4).

Then, the power source control unit 21 controls the changeover switches 12 corresponding to the stiffness control elastomers 1 so as to electrically connect each of the selected "m" number of the stiffness control elastomers 1 to the DC power source 10, and also controls the DC power source 10 so as to cause the DC power source 10 to output a DC voltage of the desired value to the stiffness control elastomers 1.

Further, the power source control unit 21 controls the changeover switches 12 corresponding to the selected "n" number of the electrostatic capacitance estimation elastomers 1 so as to electrically connect each of the electrostatic capacitance estimation elastomers 1 to the square-wave power source 11, and also controls the square-wave power source 11 to cause the square-wave power source 11 to output the square-wave signal to the electrostatic capacitance estimation elastomers 1.

The desired value of the total stiffness of the variable stiffness mechanism 100 is a desired value determined, as appropriate, by the control processing device 14 according to the operation requirements or the like of a system (e.g. a joint mechanism of a robot) provided with the variable stiffness mechanism 100, or given, as appropriate, to the control processing device 14 from an external device.

As the desired value, a desired value of, for example, the sensitivity to a change in the total elastic force (the translational elastic force that causes the movable member 4 to move along the central axis C with respect to the frame member 3) of the elastomer 1 in response to a change in the displacement amount of the movable member 4, or a desired value of an inverse value of the sensitivity can be used (the sensitivity being a so-called "spring constant").

Further, according to the present embodiment, the power source control unit 21 selects the stiffness control elastomers 1 and the electrostatic capacitance estimation elastomers 1 according to, for example, the following procedure.

Based on a desired value of the total stiffness of the variable stiffness mechanism 100, the operation mode of the power source control unit 21 is determined, and the quantities "m" and "n" of the stiffness control elastomers 1 and the electrostatic capacitance estimation elastomers 1, respectively, are determined according to the operation mode.

The operation mode in the present embodiment comes in, for example, a normal stiffness mode, in which the degree of stiffness indicated by a desired value of the total stiffness of the variable stiffness mechanism 100 is a degree of stiffness in a normal range of a predetermined value or more, a low stiffness mode, in which the degree of stiffness is lower than the degree of stiffness in the normal range and higher than a minimum degree of stiffness, and a minimum stiffness mode, in which the degree of stiffness is a minimum degree of stiffness.

The low stiffness mode and the minimum stiffness mode are modes that are used less frequently than the normal stiffness mode. Further, the minimum stiffness mode in the present embodiment is an emergency mode temporarily used to maximally buffer an impact applied to a member (e.g. the distal end of a robot arm) connected to the movable member 4 in the case where, for example, the member collides with an external object.

In the normal stiffness mode, the power source control unit 21 sets the number "n" of the electrostatic capacitance estimation elastomers 1 to a plural number n0 ($\geq 2$) determined in advance and also sets the number "m" of the stiffness control elastomers 1 to a remaining number m0 obtained by subtracting the number n0 of the electrostatic capacitance estimation elastomers 1 from a total quantity N of the variable stiffness mechanism 100 (=N−n0).

Incidentally, n0 denotes a number that is smaller than the total quantity N of the elastomers 1 of the variable stiffness mechanism 100.

If the spring constant indicating the minimum degree of stiffness of each of the elastomers 1 is denoted by kmin and the spring constant indicating the maximum degree of stiffness is denoted by kmax, then the spring constant of each of the electrostatic capacitance estimation elastomers 1 to which the square-wave signal illustrated in FIG. 4 is applied will approximately coincide with a spring constant obtained when the voltage applied to the electrostatic capacitance estimation elastomers 1 is maintained at 0 [V], that is, kmax. The spring constant of each of the elastomers 1 more specifically means the sensitivity of a change in the elastic force (the translational elastic force along the central axis C) of each of the elastomers 1 in response to a change in the displacement amount of the movable member 4.

Hence, the range of the spring constant indicating the total stiffness that can be implemented in the normal stiffness mode is a range between (n0·kmax+m0·kmin) and (N·kmax). Further, in the present embodiment, the values of the quantities n0, m0 and N and the values of kmin and kmax are set in design such that the range becomes the normal range of the total stiffness of the variable stiffness mechanism 100.

According to the present embodiment, the power source control unit 21 sets the operation mode to the normal stiffness mode and the quantities "m" and "n" of the stiffness control elastomers 1 and the electrostatic capacitance estimation elastomers 1, respectively, as described above if the spring constant indicated by the desired value of the total stiffness of the variable stiffness mechanism 100 is equal to or greater than (n0·kmax+m0·kmin).

Then, the power source control unit 21 selects, among the total quantity N of the elastomers 1 of the variable stiffness mechanism 100, the n0 number of the elastomers 1 as the electrostatic capacitance estimation elastomers 1 and the m0 number of the elastomers 1 as the stiffness control elastomers 1.

In this case, for the method of selecting which of the total quantity N of the elastomers 1 as the electrostatic capacitance estimation elastomers 1 or the stiffness control elastomers 1, a method can be adopted thereby, for example, to fixedly determine in advance the n0 number of the elastomers 1 to be selected as the electrostatic capacitance estimation elastomers 1 and the m0 number of the elastomers 1 to be selected as the stiffness control elastomers 1.

However, the elastomers 1 used as the stiffness control elastomers 1 generally deteriorate faster than the elastomers 1 used as the electrostatic capacitance estimation elastomers 1.

According to the present embodiment, therefore, the power source control unit 21 periodically changes, in the normal stiffness mode, the m0 number of the elastomers 1 to be selected as the stiffness control elastomers 1 (or the n0 number of the elastomers 1 to be selected as the electrostatic capacitance estimation elastomers 1) according to a rotation schedule established in advance. For the rotation schedule, a schedule can be adopted, in which, for example, the combination of the elastomers 1 to be selected as the stiffness control elastomers 1 is changed each time the cumulative operating time of the m0 number of the stiffness control elastomers 1 reaches a predetermined value.

Thus, it is possible to reduce the variations in the degree of deterioration progress of the elastomers 1 so as to prevent any particular elastomer 1 among the elastomers 1 of the variable stiffness mechanism 100 from deteriorating unduly faster than the remaining elastomers 1.

Further, in the low stiffness mode, the power source control unit 21 determines the quantity "n" of the electrostatic capacitance estimation elastomers 1 (where n0>n≥1) according to the desired value of the total stiffness of the variable stiffness mechanism 100 such that the quantity "n" of the electrostatic capacitance estimation elastomers 1 decreases as the desired value of the total stiffness decreases, and determines a quantity, which is obtained by subtracting the quantity "n" of the electrostatic capacitance estimation elastomers 1 from the total quantity N of the elastomers 1 (=N−n), as the quantity "m" of the stiffness control elastomers 1.

In this case, for example, the maximum value of an integer "n" that satisfies the relationship denoted by the spring constantθ(n·kmax+(N−n)·kmin) with respect to the spring constant indicated by the desired value of the total stiffness of the variable stiffness mechanism 100 in the low stiffness mode is determined as the quantity "n" of the electrostatic capacitance estimation elastomers 1. In other words, the quantity "n" of the electrostatic capacitance estimation elastomers 1 in the low stiffness mode is determined to be a maximized value within the range in which the desired value of the total stiffness of the variable stiffness mechanism 100 can be achieved.

This is because the greater the quantity "n" of the electrostatic capacitance estimation elastomers 1, the more advantageous it will be in enhancing the reliability of the estimated value of the electrostatic capacitance of the electrostatic capacitance estimation elastomers 1, as will be discussed hereinafter.

Further, the power source control unit 21 selects the "n" number of the elastomers 1 as the electrostatic capacitance estimation elastomers 1 from among the total quantity N of the elastomers 1, and also selects the "m" number of the elastomers 1 as the stiffness control elastomers 1.

In this case, according to the present embodiment, as with the case of the normal stiffness mode, the power source control unit 21 periodically changes the combination of the "m" number of the elastomers 1 to be selected as the stiffness control elastomers 1 (or the combination of the "n" number of the elastomers 1 to be selected as the electrostatic capacitance estimation elastomers 1) according to an appropriate rotation schedule so as to reduce the variations in the degree of the deterioration progress of the elastomers 1.

Alternatively, however, it is possible to restrict in advance the elastomers 1 that can be selected as the stiffness control elastomers 1.

Further, in the low stiffness mode, the power source control unit 21 sets the quantity "n" of the electrostatic capacitance estimation elastomers 1 to zero, and determines all the N number of the elastomers 1 as the stiffness control elastomers 1.

The power source control unit 21 selects the electrostatic capacitance estimation elastomers 1 and the stiffness control elastomers 1 in the operation modes (the normal stiffness mode and the low stiffness mode) as described above, except in the minimum stiffness mode.

Further, in any one of the operation modes, the power source control unit 21 determines the desired value of the output voltage of the DC power source 10 (the desired value of the voltage applied to the stiffness control elastomers 1) with respect to the stiffness control elastomers 1 that have been selected, according to the desired value of the total stiffness of the variable stiffness mechanism 100 and the quantity "m" of the stiffness control elastomers 1.

In this case, the desired value of the output voltage of the DC power source 10 is determined according to a map prepared in advance or an arithmetic expression or the like such that the desired value of the output voltage of the DC power source 10 increases as the desired value of the total stiffness of the variable stiffness mechanism 100 decreases, and increases as the quantity "m" of the stiffness control elastomers 1 decreases.

The desired value of the output voltage of the DC power source 10 in the minimum stiffness mode is a maximum voltage within a permissible range.

Further, in any one of the operation modes, the power source control unit 21 controls the changeover switches 12 corresponding to the "m" number (the N number in the minimum stiffness mode) of the selected stiffness control elastomers 1 so as to connect the selected stiffness control elastomers 1 to the DC power source 10 and also controls the DC power source 10 to cause the DC power source 10 to apply an output voltage of the desired value to the "m" number of the stiffness control elastomers 1.

Further, in the normal stiffness mode or the low stiffness mode, the power source control unit 21 controls the changeover switches 12 corresponding to the "n" number of the selected electrostatic capacitance estimation elastomers 1 so as to connect the selected electrostatic capacitance estimation elastomers 1 to the square-wave power source 11, and also controls the square-wave power source 11 to cause the square-wave power source 11 to output the square-wave signal to the "n" number of the electrostatic capacitance estimation elastomers 1.

In any one of the operation modes, by the processing carried out by the power source control unit 21 described above, the "m" number of the stiffness control elastomers 1 selected in the manner corresponding to each operation mode are connected to the DC power source 10 through the changeover switches 12 corresponding thereto. Further, the output voltage of the DC power source 10 is variably manipulated to achieve the desired value of the total stiffness of the variable stiffness mechanism 100. Thus, the total stiffness of the variable stiffness mechanism 100 is variably controlled.

Further, in the normal stiffness mode or the low stiffness mode, the "n" number of the selected electrostatic capacitance estimation elastomers 1 are connected to the square-wave power source 11 through the changeover switches 12 corresponding thereto. Then, the square-wave signal is applied from the square-wave power source 11 to the electrostatic capacitance estimation elastomers 1. Thus, the transient response current attributable to a stepped change in the voltage value of the square-wave signal is applied to the electrostatic capacitance estimation elastomers 1 during each period of the pulse widths Tw1 and Tw2 of the square-wave signal.

A description will now be given of the processing by the electrostatic capacitance estimator 22. The electrostatic capacitance estimator 22 carries out the processing of estimating the electrostatic capacitance of the electrostatic capacitance estimation elastomers 1 for each period of the pulse widths Tw1 and Tw2 of the square-wave signal in a state in which the square-wave signal is being output from the square-wave power source 11 to the electrostatic capacitance estimation elastomers 1 in the normal stiffness mode and the low stiffness mode.

In this case, the electrostatic capacitance estimator 22 carries out the processing of acquiring the detection value of the total energizing current of the electrostatic capacitance estimation elastomers 1 (hereinafter referred to simply as "the current detection value") indicated by an output of the current detector 13 in the current attenuation length in the period of each of the pulse widths Tw1 and Tw2 of the square-wave signal, and storing and holding the acquired current detection value (the processing will be hereinafter referred to as "the energizing current sampling").

Figure 6:
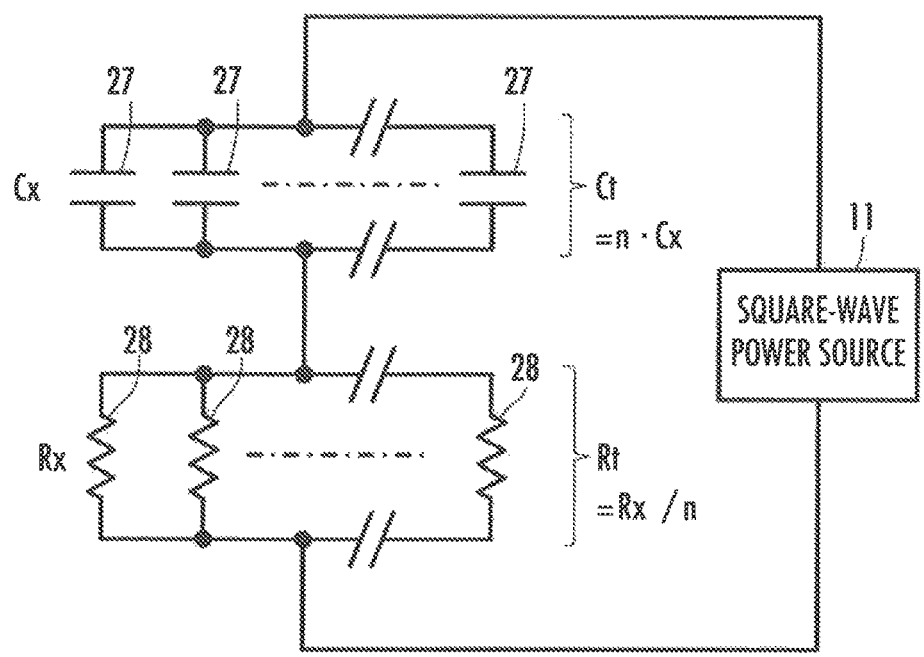
FIG. 6 is a diagram illustrating an approximate circuit configuration of a circuit system composed of the square-wave power source and the "n" number of the dielectric elastomers.

A circuit system composed of the square-wave power source 11 and the "n" number of the electrostatic capacitance estimation elastomers 1 can be approximately modeled as a circuit system composed of the "n" number of capacitive elements 27, each of which has an electrostatic capacitance value of Cx and which are connected in parallel, and the "n" number of resistive elements 28, each of which has a resistance value Rx and which are connected in parallel, the capacitive elements 27 and the resistive elements 28 being connected in series with the square-wave power source 11, as illustrated in FIG. 6.

The electrostatic capacitance Cx of each of the capacitive elements 27 corresponds to the electrostatic capacitance of each of the electrostatic capacitance estimation elastomers 1. Further, the resistance value Rx of each of the resistive elements 28 corresponds to the resultant resistance value of the resistance components of each of the electrostatic capacitance estimation elastomers 1, which includes the resistance values of the electrodes 2, 2 of each of the electrostatic capacitance estimation elastomers 1 and the resistance value of the changeover switch 12 corresponding to each of the electrostatic capacitance estimation elastomers 1.

A total electrostatic capacitance Ct of the "n" number of the capacitive elements 27 connected in parallel is denoted by n·Cx, and a total resistance value Rt of the "n" number of the resistive elements 28 connected in parallel is denoted by Rx/n.

In this case, due to the transient response phenomenon attributable to the stepped change in the square-wave signal applied to the electrostatic capacitance estimation elastomers 1, the total transient response current flowing through all the "n" number of the electrostatic capacitance estimation elastomers 1 rapidly increases to a peak value and then attenuates at a time constant defined by the total electrostatic capacitance Ct and the total resistance value Rt (=1/(Rt·Ct)).

In this case, Rt·Ct=(Rx/n)·(n·Cx)=Rx·Cx applies, so that the time constant of the attenuation of the transient response current is, in other words, a time constant defined on the basis of the electrostatic capacitance Cx and the resistance value Rx of each of the electrostatic capacitance estimation elastomers 1 (per electrostatic capacitance estimation elastomer 1), which is expressed by $(=1/(Rx \cdot Cx))$, independently of the "n" number of the electrostatic capacitance estimation elastomers 1.

Further, the peak value of the transient response current is a current value that coincides or substantially coincides with $\Delta V/Rt$ $(=n \cdot \Delta V/Rx$; $\Delta V$ denotes the amplitude value of the square-wave signal). Accordingly, the peak value of the transient response current increases as the "n" number of the electrostatic capacitance estimation elastomers 1 increases.

If the voltage value of the square-wave signal increases in steps, then the transient response current becomes a current in a direction that causes the electric charges stored in the "n" number of electrostatic capacitance estimation elastomers 1 to increase. If the voltage value of the square-wave signal decreases in steps, then the transient response current becomes a current in a direction that causes the electric charges stored in the elastomers 1 to decrease.

FIG. 5 illustrates the time-dependent change in the transient response current. The two-dot chain line in FIG. 5 indicates the time-dependent change in the transient response current in the case where the "n" number of the electrostatic capacitance estimation elastomers 1 is, for example, one, and the solid line indicates the time-dependent change in the transient response current in the case where the "n" number of the electrostatic capacitance estimation elastomers 1 is plural (e.g. three).

As illustrated in the graph, as the "n" number of the electrostatic capacitance estimation elastomers 1 increases, the peak value of the transient response current increases. Hence, the current value of the transient response current relatively markedly attenuates as time elapses.

As described above, the time constant of the attenuation of the transient response current in the current attenuation length in the period of the pulse widths Tw1 and Tw2 of the square-wave signal will be based on the electrostatic capacitance Cx and the resistance value Rx of each of the electrostatic capacitance estimation elastomers 1 (per electrostatic capacitance estimation elastomer 1). Therefore, the time-dependent change in the transient response current in the current attenuation length in the period of the pulse widths Tw1 and Tw2 of the square-wave signal is correlated to the electrostatic capacitance Cx.

Accordingly, in the energizing current sampling, the electrostatic capacitance estimator 22 acquires, in time series, the current detection values at a plurality of sampling times in the current attenuation length for each period of the pulse widths Tw1 and Tw2 of the square-wave signal.

To be specific, referring to FIG. 5, the electrostatic capacitance estimator 22 monitors the current detection value indicated by an output of the current detector 13 after each of the pulse widths Tw1 and Tw2 of the square-wave signal starts, and then sequentially acquires the current detection values at a predetermined sampling cycle dt from time t0 at which the current detection value reaching the peak value is detected (or time t0 at which it can be regarded as immediately after the peak value is reached).

In this case, the electrostatic capacitance estimator 22 stores and holds in a memory, in time series, current detection values Ir(t0), Ir(t1), . . . , Ir(tp) at sampling times t0, t1, . . . , tr in a predetermined period (the period of p·dt) until a predetermined number "p" of sampling cycles dt is reached from the foregoing time t0. Thus, the electrostatic capacitance estimator 22 acquires the time series of the (p+1) number of the current detection values Ir(t0), Ir(t1), . . . , Ir(tp) of the transient response current during the current attenuation length in the period of each of the pulse widths Tw1 and Tw2.

The start timing of the period of each of the pulse widths Tw1 and Tw2 of the square-wave signal is given from the power source control unit 21 to the electrostatic capacitance estimator 22. Further, the sampling cycle dt takes a value set in advance on the basis of a time width that is sufficiently smaller than each of the pulse widths Tw1 and Tw2 of an oscillating component.

Further, the predetermined quantity "p" and the sampling cycle dt are desirably set in advance so as to provide a relationship with a minimum value $\tau\_min$ and a maximum value $\tau\_max$ expressed by $\tau\_min \leq p \cdot dt \leq \tau\_max$, the minimum value $\tau\_min$ and the maximum value $\tau\_max$ being possible as the values of the time constant of the attenuation of the current value of the transient response current (i.e. the predetermined quantity "p" and the sampling cycle dt are desirably set such that the time width from the sampling time t0, at which the storing and holding of the current detection values is started, to the sampling time tp, at which the storing and the holding of the current detection values is ended $(=p \cdot dt)$, will be a time width within the range between $\tau\_min$ and $\tau\_max$).

The electrostatic capacitance estimator 22 carries out the electrostatic capacitance estimation processing of estimating the value of the electrostatic capacitance Cx for each period of the pulse width Tw1 or Tw2 of the oscillating component by using the (p+1) number of the current detection values Ir(t0), Ir(t1), . . . , Ir(tp) acquired as described above and a model that indicates the correlation between the time-dependent change in the transient response current and the time-dependent change in the electrostatic capacitance Cx of each of the electrostatic capacitance estimation elastomers 1 in the current attenuation length.

In this case, the foregoing model is configured, for example, as follows. The time-dependent change in the current value of the transient response current in the current attenuation length, especially a current value I(t) at any given time after time t0, can be approximated by a polynomial function (polynomial function of degree "s"), as indicated by expression (1) given below.

$$I(t) = \theta 0 + \theta 1 \cdot (t-t0) + \theta 2 \cdot (t-t0)^2 + \ldots + \theta s \cdot (t-t0)^s \tag{1}$$

Further, the current value I(t) at any given time after time t0 will change in a manner characteristic of an exponential function at a time constant defined by the resistance value Rx of each of the electrostatic capacitance estimation elastomers 1 and the electrostatic capacitance Cx of each of the elastomers 1 $(=1/(Rx \cdot Cx))$. In this case, if the change in the manner characteristic of the exponential function is approximated by the polynomial function of degree "s," as with expression (1), then the current value I(t) is represented by expression (2) given below.

$$I(t) = \frac{n \cdot \Delta V}{Rx} \cdot \sum_{j=0}^{s} \frac{(-1)^j}{j! \cdot (Rx \cdot Cx)^j} \cdot (t-t0)^j \tag{2}$$

"j!" of each term of $\Sigma$ of the right side of expression (2) means the factorial of an integer value "j" (j=0, 1, . . . , s). Further, "n" denotes the quantity of the electrostatic capacitance estimation elastomers 1, and $\Delta V$ denotes the amplitude value of the square-wave signal.

Accordingly, coefficients $\theta 0, \theta 1, \ldots, \theta s$ of the right side of expression (1) will have the relationship denoted by expression (3) given below with respect to the electrostatic capacitance Cx and the resistance value Rx.

$$\begin{bmatrix} \theta 0 \\ \theta 1 \\ \vdots \\ \theta s \end{bmatrix} = \begin{bmatrix} \dfrac{n \cdot \Delta V}{Rx} \\ \dfrac{n \cdot \Delta V}{Rx} \cdot \dfrac{(-1)}{Rx \cdot Cx} \\ \vdots \\ \dfrac{n \cdot \Delta V}{Rx} \cdot \dfrac{(-1)^s}{s! \cdot (Rx \cdot Cx)^s} \end{bmatrix} \quad (3)$$

Meanwhile, when focusing attention on the change amount, from the current value I(t0) at time t0, of the current value during the current attenuation length of the transient response current, expression (4) given below is obtained for the (p+1) number of the current values I(t0), I(t1), ..., I(tp). In expression (4), ↑$\Delta$Ip and ↑$\Theta$ denote vectors (vertical vectors) defined by expressions (4a) and (4b), respectively, and Mtp denotes a matrix defined according to expression (4c) by using the sampling cycle dt of the current detection value in the current attenuation length.

$$\uparrow \Delta Ip = Mtp \cdot \uparrow \Theta \quad (4)$$

where, $$\uparrow \Delta Ip \equiv \begin{bmatrix} I(t1) - I(t0) \\ I(t2) - I(t0) \\ \vdots \\ I(tp) - I(t0) \end{bmatrix} \quad (4a)$$

$$\uparrow \Theta \equiv \begin{bmatrix} \theta 1 \\ \theta 2 \\ \vdots \\ \theta s \end{bmatrix} \quad (4b)$$

$$Mtp \equiv \begin{bmatrix} dt & dt^2 & \cdots & dt^s \\ 2 \cdot dt & (2 \cdot dt)^2 & \cdots & (2 \cdot dt)^s \\ \vdots & \vdots & \ddots & \vdots \\ p \cdot dt & (p \cdot dt)^2 & \cdots & (p \cdot dt)^s \end{bmatrix} \quad (4c)$$

From expression (4), therefore, expression (5) given below is derived for calculating ↑$\Theta$ from the (p+1) number of the current values I(t0), I(t1), ..., I(tp).

$$\uparrow \Theta = (Mtp)^{-1} \cdot \uparrow \Delta Ip \quad (5)$$

$(Mtp)^{-1}$ denotes an inverse matrix in a standard meaning in the case where p=s, and $(Mtp)^{-1}$ denotes a pseudo inverse matrix in the case where p>s.

Further, based on expression (3) given above, the relationship between ↑$\Theta$ and the electrostatic capacitance Cx and the resistance value Rx is represented by expression (6) given below. ↑$\Delta$RC denotes a vector (vertical vector) defined by expression (6a).

$$\uparrow \Theta = \uparrow \Delta RC \quad (6)$$

where, $$\uparrow \Delta RC \equiv \begin{bmatrix} \dfrac{n \cdot \Delta V}{Rx} \cdot \dfrac{(-1)}{Rx \cdot Cx} \\ \dfrac{n \cdot \Delta V}{Rx} \cdot \dfrac{(-1)^2}{2! \cdot (Rx \cdot Cx)^2} \\ \vdots \\ \dfrac{n \cdot \Delta V}{Rx} \cdot \dfrac{(-1)^s}{s! \cdot (Rx \cdot Cx)^s} \end{bmatrix} \quad (6a)$$

Therefore, from expressions (5) and (6), the values of the electrostatic capacitance Cx and the resistance value Rx can be determined.

According to the present embodiment, therefore, the electrostatic capacitance estimator 22 uses the foregoing expressions (5) and (6) as the model that represents the correlation between the time-dependent change in the transient response current and the electrostatic capacitance Cx of each of the electrostatic capacitance estimation elastomers 1 in the current attenuation length thereby to estimate the electrostatic capacitance Cx in the electrostatic capacitance estimation processing for each period of the pulse width Tw1 or Tw2 of the oscillating component.

More specifically, the electrostatic capacitance estimator 22 calculates the vector ↑$\Theta$, the components of which are the coefficients $\theta 1, \theta 2, \ldots, \theta s$ of the polynomial functions of expression (1), according to expression (5) given above by using the (p+1) number of the current detection values Ir(t0), Ir(t1), ..., Ir(tp), which have been acquired by the energizing current sampling and correction processing in the period of the pulse width Tw1 or Tw2 of the oscillating component, as the current values I(t0), I(t1), ..., I(tp), respectively, in expression (5). In this case, the value of the sampling cycle dt is a fixed value set in advance.

Then, with respect to the calculated vector ↑$\Theta$, the electrostatic capacitance estimator 22 calculates the electrostatic capacitance Cx that satisfies (or substantially satisfies) the relationship indicated by expression (6) and also calculates the resistance value Rx. In this case, if the set value of the degree "s" of the polynomial function of expression (1) is 2 (s=2), then the electrostatic capacitance Cx and the resistance value Rx can be calculated by using two expressions given by expression (6) as simultaneous equations.

Further, if the set value of the degree "s" is greater than 2 (s>2), then the values of the electrostatic capacitance Cx and the resistance value Rx can be determined by an appropriate search processing technique or the like such that the square value of a vector (↑$\Theta$−↑$\Delta$RC) is minimized, the square value being expressed by (=|↑$\Theta$−↑$\Delta$RC|$^2$).

In this case, the value of $\Delta V$ (the amplitude value of the square-wave signal) related to ↑$\Delta$RC is a predetermined value prepared in advance, and the value of "n" denotes the quantity of the electrostatic capacitance estimation elastomers 1 selected by the power source control unit 21.

The processing by the electrostatic capacitance estimator 22 is carried out as described above. Thus, the estimated value of the electrostatic capacitance Cx per electrostatic capacitance estimation elastomer 1 will be determined on the basis of the current detection values Ir(t0), Ir(t1), ..., Ir(tp) in the current attenuation length of the transient response current for each period of the pulse width Tw1 or Tw2 of the square-wave signal (i.e. each time the voltage value of the square-wave signal changes in steps).

Supplementarily, an expression obtained by replacing (n·$\Delta$V/Rx) by ($\Delta$V/Rt) and (Rx·Cx) by (Rt·Ct) in expression (6) may be used in place of expression (6) to determine the estimated value of the total electrostatic capacitance Ct of the "n" number of the electrostatic capacitance estimation elastomers 1. Further, the value obtained by dividing the estimated value by the quantity of "n" may be determined as the estimated value of the electrostatic capacitance Cx per electrostatic capacitance estimation elastomer 1.

A description will now be given of the processing carried out by the displacement amount estimator 23. The square-wave signal applied from the square-wave power source 11 to the electrostatic capacitance estimation elastomers 1 is a periodic voltage signal having a small amplitude value $\Delta V$.

Hence, the voltage applied to the electrostatic capacitance estimation elastomers 1 can be regarded to be maintained approximately at a substantially constant voltage (approximately 0 [V] in the present embodiment). Thus, it can be regarded that there is substantially no occurrence of a change in the thickness of the electrostatic capacitance estimation elastomers 1 caused by the application of the square-wave signal.

Figure 7:
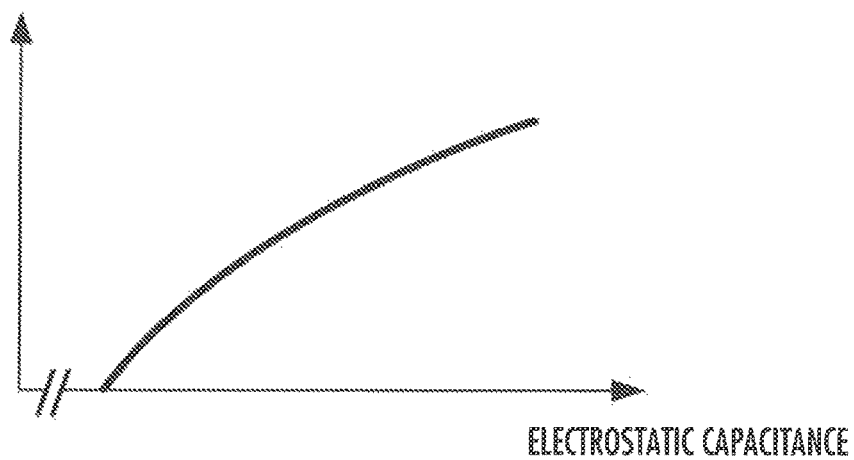
FIG. 7 is a graph illustrating the relationship between the electrostatic capacitance of the "n" number of the dielectric elastomers to which the square-wave signal is imparted and the amount of relative displacement of a movable member (a second member) with respect to a frame member (a first member).

In this case, the electrostatic capacitance of the electrostatic capacitance estimation elastomers 1 depends mainly on the displacement amount of the movable member 4 and has a certain correlation with the displacement amount. The displacement amount estimator 23, therefore, determines the estimated value of the displacement amount of the movable member 4 from the estimated value of the electrostatic capacitance Cx supplied by the electrostatic capacitance estimator 22 according to a data table or an arithmetic expression prepared in advance, which indicates the correlation between the electrostatic capacitance Cx per electrostatic capacitance estimation elastomer 1 and the displacement amount of the movable member 4. In this case, according to the correlation indicated by the data table or the arithmetic expression, as the electrostatic capacitance Cx increases, the displacement amount of the movable member 4 increases, as illustrated in FIG. 7.

According to the embodiment described above, in the normal stiffness mode and the low stiffness mode, the "n" number (n≥1) of elastomers 1 among the N number of the elastomers 1 of the variable stiffness mechanism 100 are used as the electrostatic capacitance estimation elastomers 1 and the remaining "m" number of the elastomers 1 are used as the stiffness control elastomers 1.

Further, in the low stiffness mode, the quantity "n" of the electrostatic capacitance estimation elastomers 1 and the quantity "m" of the stiffness control elastomers 1 are variably set.

Thus, the total stiffness of the variable stiffness mechanism 100 can be variably controlled over an extensive range. In addition, concurrently with the control of the total stiffness, the electrostatic capacitance Cx per electrostatic capacitance estimation elastomer 1 can be estimated. Further, based on the estimated value of the electrostatic capacitance Cx, the displacement amount of the movable member 4 (the amount of the relative displacement between the frame member 3 and the movable member 4) can be estimated.

In this case, the processing of controlling the total stiffness of the variable stiffness mechanism 100, the processing of estimating the electrostatic capacitance Cx, and the processing of estimating the displacement amount of the movable member 4 can be carried out without mutual interference (without adversely affecting each other).

Further, only a square-wave signal of a relatively small fixed amplitude value ΔV is steadily applied to the electrostatic capacitance estimation elastomers 1 from the square-wave power source 11. Hence, the time-dependent change (attenuation pattern) in the current attenuation length of the transient response current flowing through the electrostatic capacitance estimation elastomers 1 in the period of each of the pulse widths Tw1 and Tw2 of the square-wave signal is closely correlated with the electrostatic capacitance Cx. Further, the electrostatic capacitance Cx is also closely correlated with the displacement amount of the movable member 4.

Thus, the electrostatic capacitance Cx per electrostatic capacitance estimation elastomer 1 can be estimated with high reliability on the basis of the time series of the current detection values in the period of each of the pulse widths Tw1 and Tw2 of the square-wave signal. In addition, the displacement amount of the movable member 4 can be estimated with high reliability.

Especially in the normal stiffness mode, a plurality of n0 elastomers 1 are used as the electrostatic capacitance estimation elastomers 1. This makes it possible to maximize the peak value of the transient response current during the period of each of the pulse widths Tw1 and Tw2 of the square-wave signal within the range of a limit current or less based on an overcurrent protection function of the square-wave power source 11.

As a result, the time-dependent change in the transient response current in the current attenuation length can be detected with a high resolution. This in turn makes it possible to increase the S/N ratio in the processing of estimating the electrostatic capacitance Cx. Thus, the reliability of the estimated value of the electrostatic capacitance Cx and the reliability of the estimated value of the displacement amount of the movable member 4 can be ideally enhanced.

Further, in the low stiffness mode, the quantity "n" of the electrostatic capacitance estimation elastomers 1 can be maximized within the range, in which a desired value of the total stiffness can be attained, by variably setting the quantity "n" of the electrostatic capacitance estimation elastomers 1 according to the desired value of the total stiffness of the variable stiffness mechanism 100. This makes it possible to maximally enhance the reliability of the estimated value of the electrostatic capacitance Cx and the reliability of the estimated value of the displacement amount of the movable member 4.

Further, in the minimum stiffness mode, the total stiffness of the variable stiffness mechanism 100 can be set to the minimum stiffness by using all the N number of the elastomers 1 as the stiffness control elastomers 1 and by applying a maximum voltage from the DC power source 10 to the stiffness control elastomers 1. Hence, if, for example, a member (e.g. a distal end portion of a robot arm) connected to the movable member 4 collides with an external object, the impact to be applied to the member can be effectively reduced.

The present invention is obviously not limited to the embodiment described above. Some modifications will be described below.

In the foregoing embodiment, the quantity "n" of the electrostatic capacitance estimation elastomers 1 and the quantity "m" of the stiffness control elastomers 1 in the normal stiffness mode have been set to the fixed values n0 and m0, respectively. Alternatively, however, the quantity "n" of the electrostatic capacitance estimation elastomers 1 and the quantity "m" of the stiffness control elastomers 1 in the normal stiffness mode may be variably set according to the desired value of the total stiffness of the variable stiffness mechanism 100, as with the low stiffness mode.

Alternatively, the quantity "n" of the electrostatic capacitance estimation elastomers 1 and the quantity "m" of the stiffness control elastomers 1 in the normal stiffness mode or the low stiffness mode may be variably set according to, for example, a required accuracy of the estimated value of the electrostatic capacitance Cx, in place of the desired value of the total stiffness of the variable stiffness mechanism 100 or in addition to the desired value. In this case, the quantity "n" of the electrostatic capacitance estimation elastomers 1 is desirably increased as the required accuracy of the estimated value of the electrostatic capacitance Cx increases.

Further, in the foregoing embodiment, the square-wave signal of a voltage value in the vicinity of zero [V] has been adopted as the square-wave signal applied to the electrostatic capacitance estimation elastomers 1. Alternatively, however, the square-wave signal may be a square-wave signal, in which the mean voltage value (i.e. the central voltage value) in the period of one cycle thereof is offset to a higher voltage value (a voltage value that is larger than the amplitude value $\Delta V$).

In such a case, the stiffness of the electrostatic capacitance estimation elastomers 1 can be set to be smaller than the stiffness in the foregoing embodiment (the stiffness corresponding to the maximum spring constant kmax).

For example, if the central voltage value of the square-wave signal is set to a value close to a maximum voltage in a permissible range of the output voltage of the DC power source 10, then the stiffness of the electrostatic capacitance estimation elastomers 1 can be set to the minimum stiffness in the foregoing embodiment (the stiffness corresponding to the minimum spring constant kmin). In this case, in the minimum stiffness mode, all the N number of the elastomers 1 can be used as the electrostatic capacitance estimation elastomers 1 rather than being used as the stiffness control elastomers 1. Thus, the estimation of the electrostatic capacitance Cx and the estimation of the displacement amount of the movable member 4 can be performed while attaining the minimum total stiffness of the variable stiffness mechanism 100.

Further, the square-wave power source 11 may be configured such that the central voltage value of the square-wave signal can be changed, as appropriate. In such a case, the stiffness of the electrostatic capacitance estimation elastomers 1 can be changed, as appropriate. In this case, desirably, the central voltage value of the square-wave signal is slowly changed or the frequency of changing the central voltage value is minimized in order to achieve maximized enhancement of the reliability of the estimated value of the electrostatic capacitance Cx obtained by the processing carried out by the electrostatic capacitance estimator 22.

Further, in the foregoing embodiment, the processing of estimating the electrostatic capacitance Cx has been carried out for each period of the pulse widths Tw1 and Tw2 of the square-wave signal. However, it is also possible to, for example, carry out the processing of estimating the electrostatic capacitance Cx only during the period of one of the pulse widths Tw1 and Tw2. In this case, the other pulse width may be a very small pulse width.

Further, in the foregoing embodiment, the square-wave signal has been adopted as the voltage signal for supplying the transient response current to the electrostatic capacitance estimation elastomers 1. Alternatively, however, the voltage signal for supplying the transient response current, which causes the attenuation of current according to the electrostatic capacitance of the electrostatic capacitance estimation elastomers 1, may be a voltage signal other than the square-wave signal. A voltage signal, such as a sawtooth voltage signal or a curved voltage signal, can be adopted.

Further, in the foregoing embodiment, the description has been given in relation to the variable stiffness mechanism 100 provided with the sheet-like elastomers 1. However, the elastomers of the variable stiffness mechanism in the present invention may have any shapes other than the sheet-like shape insofar as the elastomers are capable of changing the stiffness between two members.

What is claimed is:

1. A control device of a variable stiffness mechanism which includes a first member and a second member, which are relatively displaceable with each other, and a plurality of dielectric elastomers interposed in parallel between the first member and the second member such that an elastic force is generated according to the relative displacement of the first member and the second member, and which is configured to be capable of changing a stiffness of each of the dielectric elastomers by variably manipulating a voltage to be applied to each of the dielectric elastomers, the control device comprising:

a first power source that variably outputs a voltage for controlling the stiffness of each of an "m" number (m: an integer of 1 or more) of dielectric elastomers among the plurality of dielectric elastomers to each of the "m" number of the dielectric elastomers;

a second power source that outputs a voltage signal which has a predetermined cycle for estimating an electrostatic capacitance of an "n" number (n: an integer of 1 or more) of dielectric elastomers among the plurality of dielectric elastomers excluding the "m" number of the dielectric elastomers, and which is for supplying a current correlated to the electrostatic capacitance of the "n" number of the dielectric elastomers to each of the "n" number of the dielectric elastomers; and an electrostatic capacitance estimating unit which acquires a detection value of an energizing current flowing between the second power source and the "n" number of the dielectric elastomers in a state in which the voltage signal is being output from the second power source, and which estimates the electrostatic capacitance of the "n" number of the dielectric elastomers by using the detection value of the energizing current.

2. The control device of the variable stiffness mechanism according to claim 1, further comprising:

a displacement amount estimating unit which estimates an amount of the relative displacement between the first member and the second member from an estimated value of the electrostatic capacitance estimated by the electrostatic capacitance estimating unit.

3. The control device of the variable stiffness mechanism according to claim 1, wherein a voltage signal output from the second power source is a voltage signal having a voltage value thereof changing in steps at a predetermined cycle, and the electrostatic capacitance estimating unit is configured to carry out:

energizing current sampling processing for acquiring the detection values of the energizing current at a plurality of sampling times in a current attenuation length, in which the energizing current increases and then attenuates according to a stepped change in the voltage value of the voltage signal and electrostatic capacitance estimation processing of determining an estimated value of the electrostatic capacitance of the "n" number of the dielectric elastomers from a model expressing a correlation between a time-dependent change in the energizing current and the electrostatic capacitance of the "n" number of the dielectric elastomers in the current attenuation length, and the detection values of the energizing currents at the plurality of sampling times.

4. The control device of the variable stiffness mechanism according to claim 3, wherein a quantity "n" of the "n" number of the dielectric elastomers is plural.

5. The control device of the variable stiffness mechanism according to claim 1, wherein a current path between the first power source and the plurality of dielectric elastomers is configured such that a quantity "m" or a combination of the "m" number of the dielectric elastomers can be selectively changed.

6. The control device of the variable stiffness mechanism according to claim 1, wherein
a current path between the second power source and the plurality of dielectric elastomers is configured such that a quantity "n" or a combination of the "n" number of the dielectric elastomers can be selectively changed.

7. The control device of the variable stiffness mechanism according to claim 1, wherein
each of the dielectric elastomers of the variable stiffness mechanism is formed like a sheet, and configured such that an output voltage of the first power source or the second power source can be applied in a direction of a thickness thereof, and a peripheral edge portion and a central portion of each of the dielectric elastomers are fixed to the first member and the second member, respectively, which are relatively movable in the direction of the thickness of the dielectric elastomers, and each of the dielectric elastomers is tightly installed such that a tension is imparted thereto between the first member and the second member in a state in which no output voltage of the first power source or the second power source is being applied.

* * * * *